(12) United States Patent
Sanders

(10) Patent No.: US 9,533,448 B2
(45) Date of Patent: Jan. 3, 2017

(54) ELECTRONIC DISPLAY MOUNTING APPARATUS

(71) Applicant: The Boeing Company, Chicago, IL (US)

(72) Inventor: Andrew A. Sanders, Marysville, WA (US)

(73) Assignee: THE BOEING COMPANY, Chicago, IL (US)

( * ) Notice: Subject to any disclaimer, the term of this patent is extended or adjusted under 35 U.S.C. 154(b) by 99 days.

(21) Appl. No.: 14/209,609

(22) Filed: Mar. 13, 2014

(65) Prior Publication Data

US 2015/0259068 A1     Sep. 17, 2015

(51) Int. Cl.

| | |
|---|---|
| *F16M 13/02* | (2006.01) |
| *B60R 7/04* | (2006.01) |
| *B29C 67/00* | (2006.01) |
| *B33Y 80/00* | (2015.01) |
| *B64D 45/00* | (2006.01) |
| *B29L 31/00* | (2006.01) |
| *B33Y 10/00* | (2015.01) |

(52) U.S. Cl.
CPC ............ *B29C 67/0051* (2013.01); *B33Y 80/00* (2014.12); *B64D 45/00* (2013.01); *B29L 2031/00* (2013.01); *B33Y 10/00* (2014.12); *B64D 2045/0075* (2013.01); *Y10T 29/4984* (2015.01)

(58) Field of Classification Search
CPC .................. B64D 2045/0075; B64D 11/0015; A45F 2200/0516; A45F 2200/0515
USPC .......................... 224/929, 197; 403/92, 95, 96
See application file for complete search history.

(56) References Cited

U.S. PATENT DOCUMENTS

| | | | | |
|---|---|---|---|---|
| 5,600,870 | A * | 2/1997 | Fields | A61F 9/025 16/342 |
| 8,662,362 | B1 * | 3/2014 | Bastian | H04B 1/3888 224/197 |
| 8,915,361 | B2 * | 12/2014 | Rayner | G06F 1/1601 206/320 |
| 2008/0295301 | A1 * | 12/2008 | Carnevali | F16B 2/065 24/525 |
| 2008/0296334 | A1 * | 12/2008 | Carnevali | B60R 11/0241 224/558 |
| 2011/0278885 | A1 * | 11/2011 | Procter | B60R 11/0235 297/135 |

* cited by examiner

*Primary Examiner* — Adam Waggenspack

(57) ABSTRACT

A mounting apparatus includes a cradle, a stand, a cradle attachment member, and a rotation member. The cradle includes an electronic display attachment member which is configured to removably attach an electronic display to the cradle. The cradle attachment member is configured to removably attach the cradle to the stand. The rotation member is configured to allow rotation of the electronic display when it is attached to the electronic display attachment member.

11 Claims, 6 Drawing Sheets

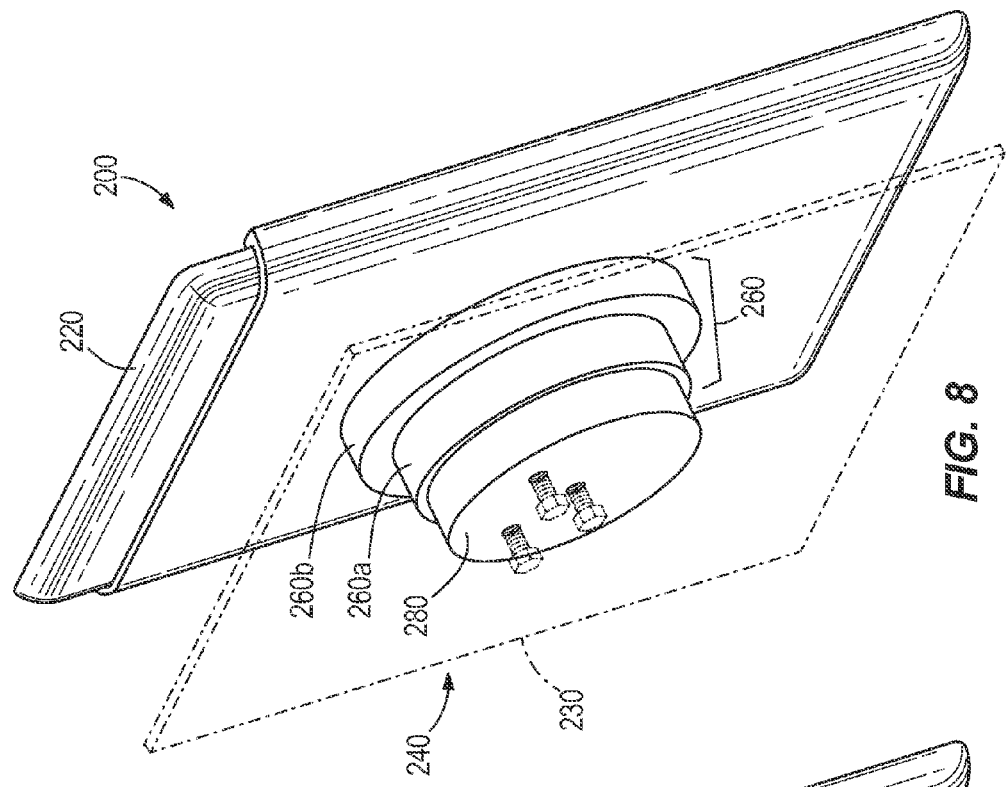
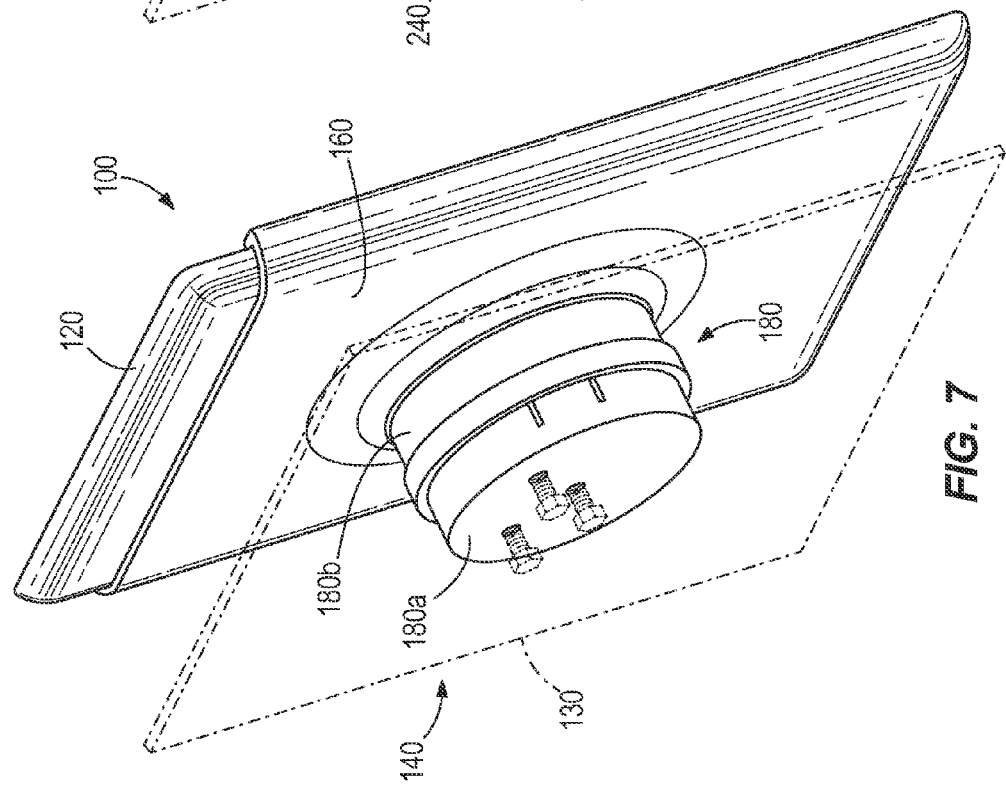

… (1)

ELECTRONIC DISPLAY MOUNTING APPARATUS

FIELD OF THE DISCLOSURE

This disclosure relates to an electronic display mounting apparatus which allows an electronic display to be rotateably mounted to an aircraft or another structure.

BACKGROUND

Aircraft such as the Boeing 777 have cockpits with instrument panels holding controls in efficient spacing arrangements effectively utilizing the space. It is difficult to removably or rotateably mount a portable electronic display, such as a tablet, an IPad, an electronic flight bag device, or a hand-held computer, in the instrument panel without interfering with the pilot's view-lines of the controls of the instrument panel. Other non-aircraft structures utilizing efficient spacing may also have this same issue.

An apparatus and method is needed to resolve one or more issues of one or more of the existing apparatus and methods for removably mounting a portable electronic display to a structure.

SUMMARY

In one embodiment, a mounting apparatus includes a cradle, a stand, a cradle attachment member, and a rotation member. The cradle includes an electronic display attachment member which is configured to removably attach an electronic display to the cradle. The cradle attachment member is configured to removably attach the cradle to the stand. The rotation member is configured to allow rotation of the electronic display when it is attached to the electronic display attachment member.

In another embodiment, an aircraft includes a cradle, a stand, a stand attachment member, a cradle attachment member, and a rotation member. The cradle includes an electronic display attachment member which is configured to removably attach an electronic display to the cradle. The stand attachment member removably attaches the stand to the aircraft. The cradle attachment member removably attaches the cradle to the stand. The rotation member is configured to allow rotation of the electronic display when it is attached to the electronic display attachment member.

In still another embodiment, a method of attaching an electronic display to an aircraft is disclosed. In one step, an electronic display is attached to a mounting apparatus attached to an instrument panel of an aircraft. In another step, the electronic display is rotated by rotating a portion of the mounting apparatus while the electronic display is held by the mounting apparatus The scope of the present disclosure is defined solely by the appended claims and is not affected by the statements within this summary.

BRIEF DESCRIPTION OF THE DRAWINGS

The disclosure can be better understood with reference to the following drawings and description. The components in the figures are not necessarily to scale, emphasis instead being placed upon illustrating the principles of the disclosure.

FIG. 7 illustrates a back perspective view of another embodiment of a mounting apparatus holding an electronic display;

FIG. 8 illustrates a back perspective view of another embodiment of a mounting apparatus holding an electronic display.

DETAILED DESCRIPTION

Figure 1:
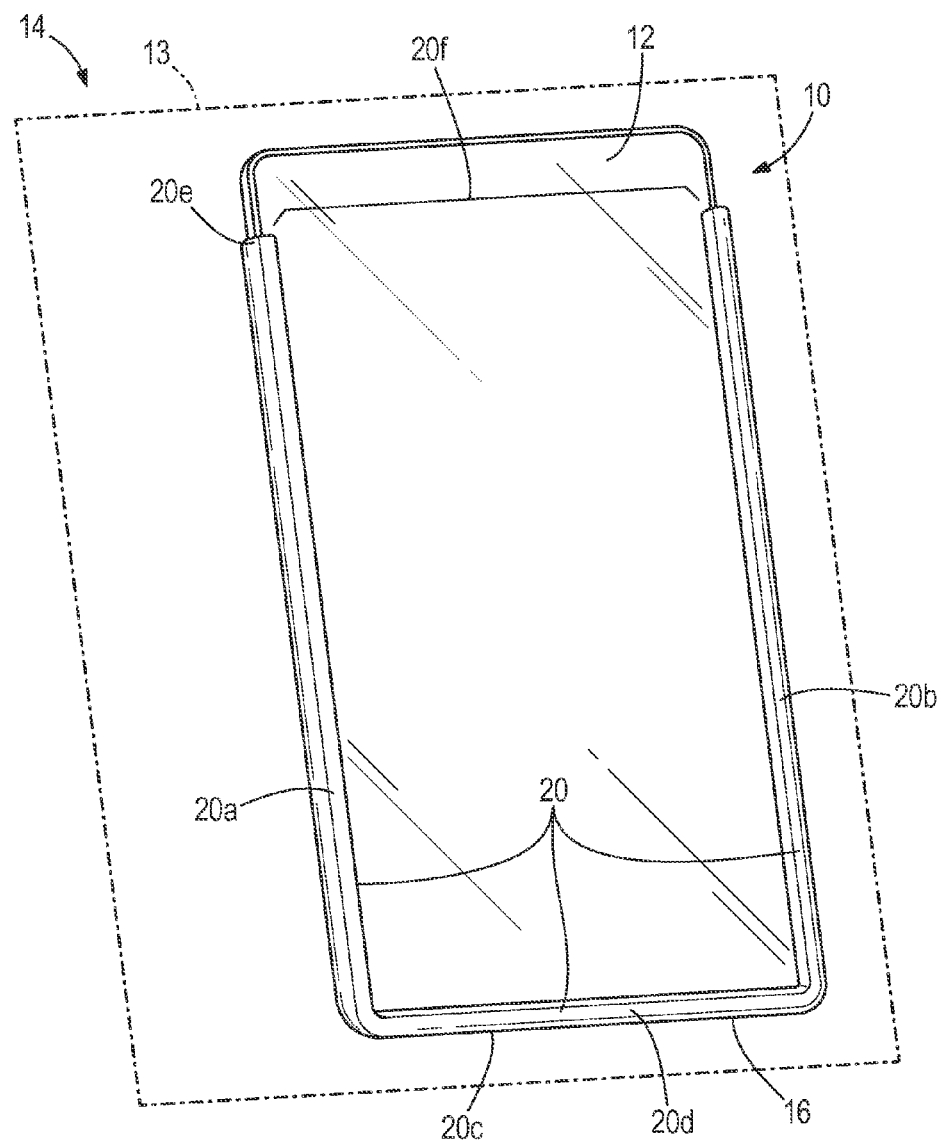
FIG. 1 illustrates a perspective view of a front perspective view of a mounting apparatus holding an electronic display.
Figure 2:
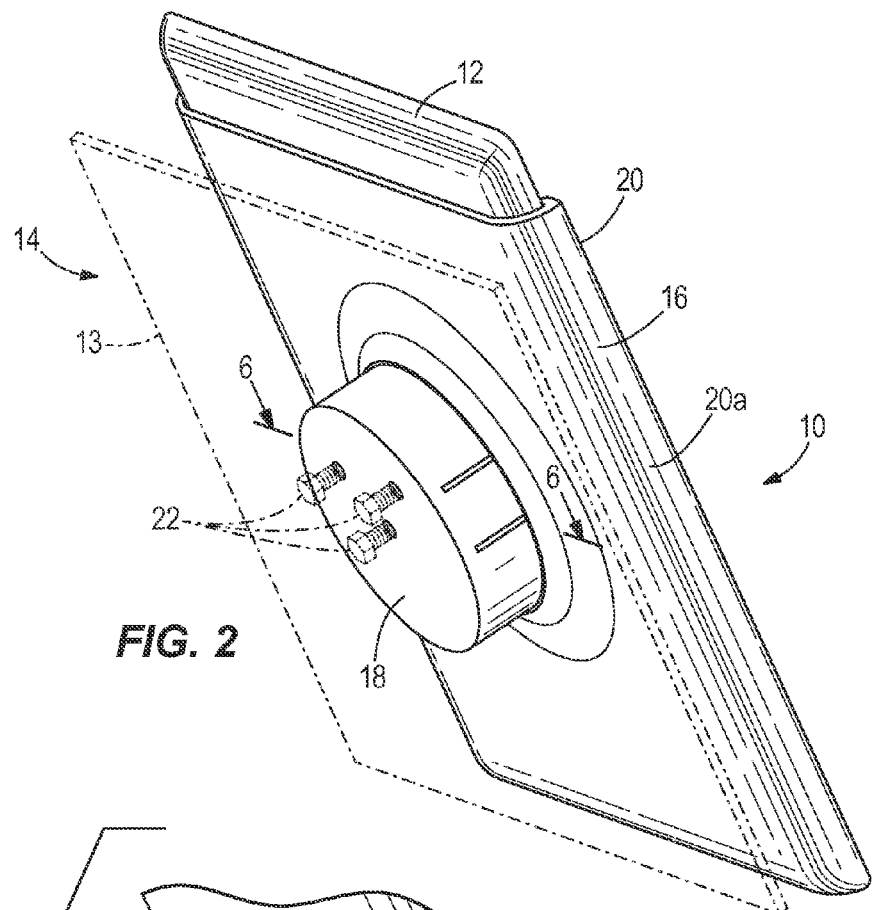
FIG. 2 illustrates a back perspective view of the mounting apparatus of FIG. 1.

FIG. 1 illustrates a perspective view of a front perspective view of a mounting apparatus 10 holding an electronic display 12. FIG. 2 illustrates a back perspective view of the mounting apparatus 10 of FIG. 1. The mounting apparatus 10 is attached to an instrument panel 13 of an aircraft 14. In other embodiments, the mounting apparatus 10 may be attached to varying structures. As shown in FIGS. 1 and 2, the mounting apparatus 10 comprises a cradle 16 and a stand 18. The electronic display 12 comprises a tablet, an IPad, an electronic flight bag device, or a hand-held computer. In other embodiments, the electronic display 12 may vary.

The cradle 16 comprises an electronic display attachment member 20 which is configured to removably attach the electronic display 12 to the cradle 16. The electronic display attachment member 20 comprises two opposed rails 20a and 20b which are configured to removably slide the electronic display between the two opposed rails 20a and 20b. The electronic display attachment member 20 further comprises at a first end 20c a third rail 20d extending between the two opposed rails 20a and 20b. The third rail 20d is configured to stop the electronic display 12 from sliding past the third rail 20d. The electronic display attachment member 20 further comprises at a second end 20e an open pocket 20f extending between the two opposed rails 20a and 20b. The open pocket 20f is configured to allow the electronic display 12 to be slid into the open pocket 20f between the two opposed rails 20a and 20b until it abuts against the third rail 20d so that the electronic display 12 is held in place by the two opposed rails 20a and 20b and the third rail 20d. The cradle 16 including the electronic display attachment member 20 may be made from a selective laser sintering 3-D printing process. In one embodiment, the cradle 16 and the electronic display attachment member 20 may be plastic. In other embodiments the cradle 16 and the electronic display attachment member 20 may vary in manufacture, shape, size, structure, quantity, configuration, orientation, or material.

The stand 18 is removably attached to the instrument panel 13 of the aircraft 14 with a stand attachment member 22. The stand attachment member 22 comprises a plurality of bolts which bolt the stand 18 to the instrument panel 13 of the aircraft 14. The stand attachment member 22 made be made from a selective laser sintering 3-D printing process and may be plastic. In other embodiments, the stand 18 and the stand attachment member 22 may vary in manufacture, shape, size, structure, quantity, configuration, orientation, or material.

Figure 3:
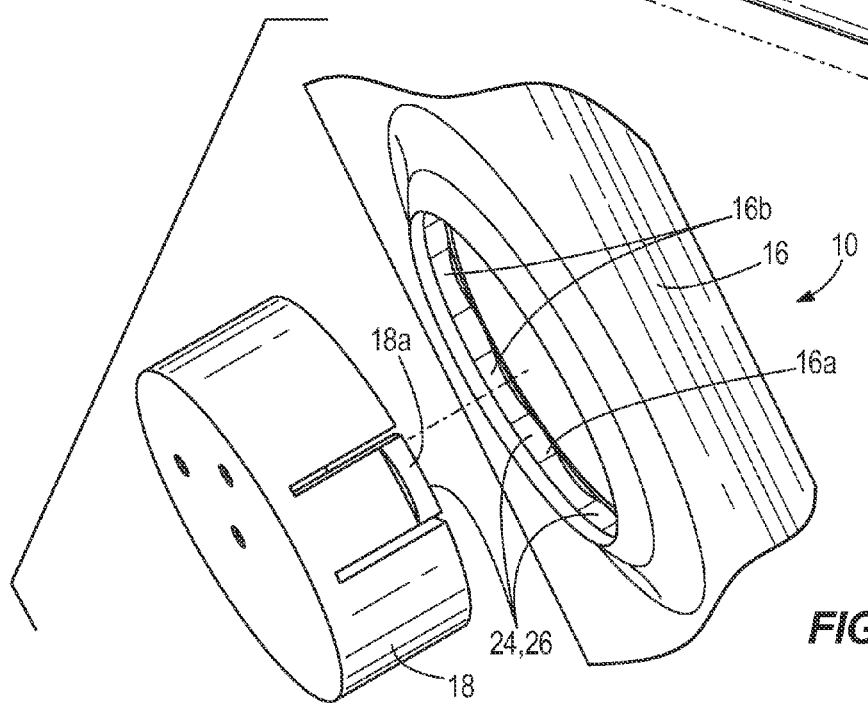
FIG. 3 illustrates a disassembled back perspective view of the mounting apparatus of FIG. 2 with the stand detached from the cradle.
Figure 4:
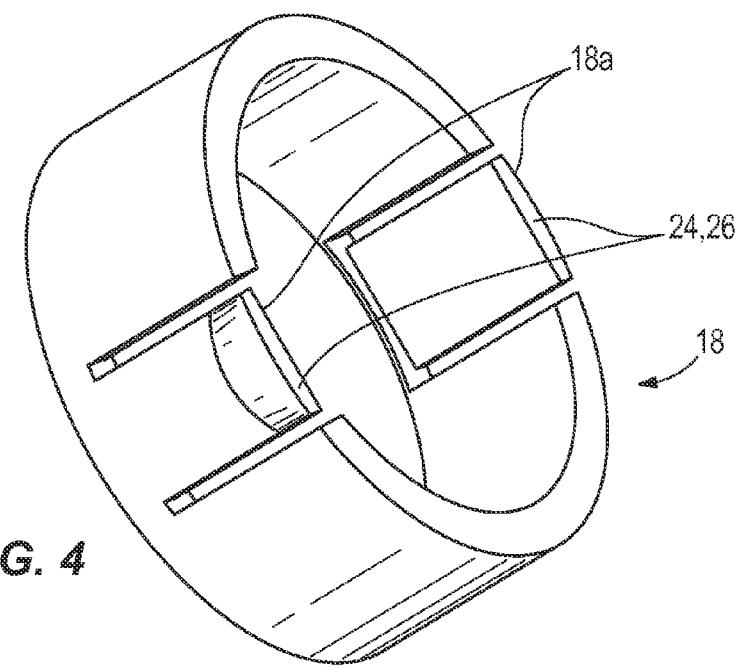
FIG. 4 illustrates a front perspective view of the stand of FIG. 3.
Figure 5:
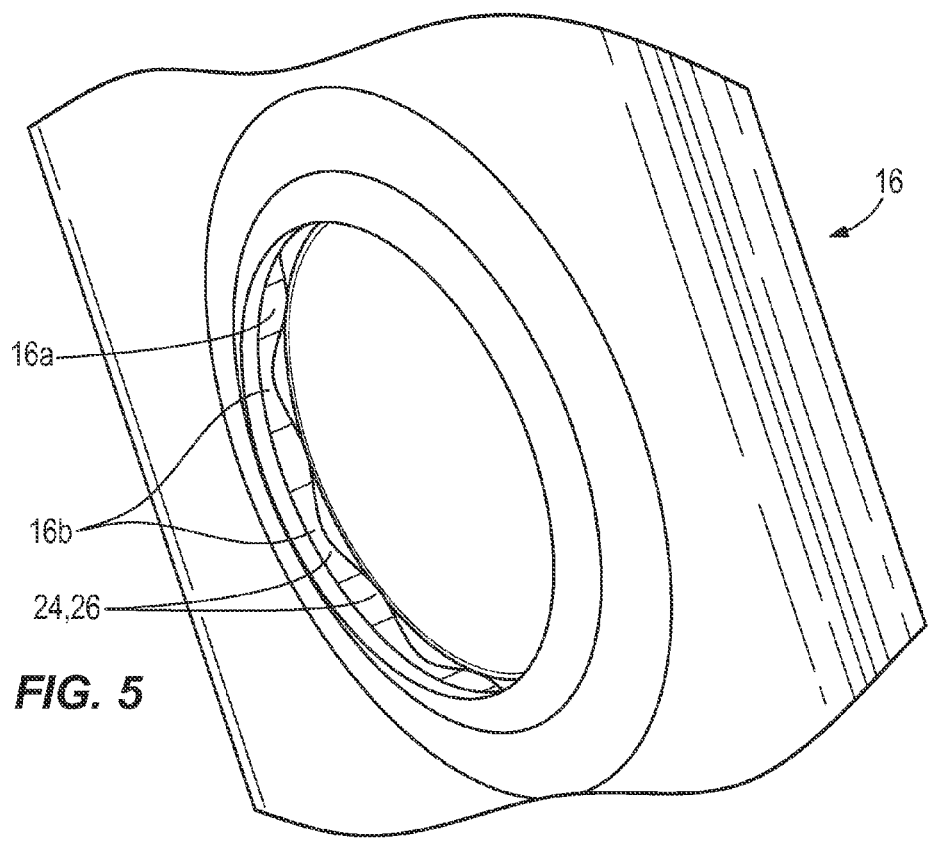
FIG. 5 illustrates a back perspective view of the cradle of FIG. 3.
Figure 6:
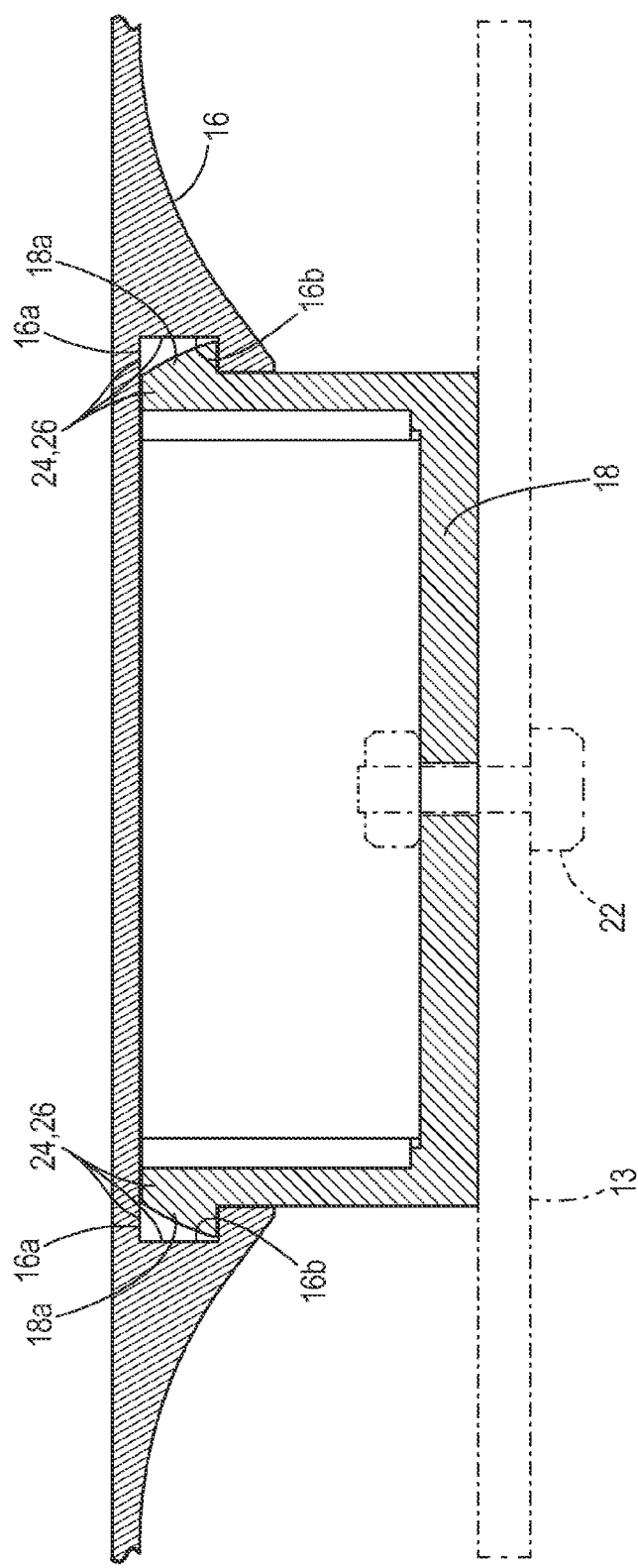
FIG. 6 illustrates a cross-sectional view through line 6-6 of FIG. 2.

FIG. 3 illustrates a disassembled back perspective view of the mounting apparatus 10 of FIG. 2 with the stand 18 detached from the cradle 16. FIG. 4 illustrates a front perspective view of the stand 18 of FIG. 3. FIG. 5 illustrates a back perspective view of the cradle 16 of FIG. 3. FIG. 6 illustrates a cross-sectional view through line 6-6 of FIG. 2.

As shown collectively in FIGS. 3-6, a cradle attachment member 24 removably attaches the cradle 16 to the stand 18. The cradle attachment member 24 comprises tabs 18a of the stand 18, channel 16a of the cradle 16, and notches 16b of the cradle 16. The tabs 18a of the stand 18 are springy and resilient. In another embodiment, the tabs 18a may be hinged to the stand 18 without comprising an integral portion of the stand 18. When the cradle 16 is pushed against the stand 18, the tabs 18a of the stand 18 initially compress allowing the tabs 18a to be fitted into the channel 16a of the cradle 16. Once the tabs 18a are disposed within the channel 16a of the cradle 16, the tabs 18a extend against and within the channel 16a thereby attaching the cradle 16 to the stand 18. Since the channel 16a of the cradle 16 is circular, the channel 16a of the cradle 16 allows 360 degree rotation of the cradle 16 relative to the stand 18 with the tabs 18a disposed in the channel 16a and following the circular path of the channel 16a as the cradle 16 is rotated relative to the stand 18. Twelve notches 16b are disposed every 30 degrees around and within the channel 16a. In other embodiments, the number, configuration, and orientation of the notches 16b may vary. When the cradle 16 is rotated relative to the stand 18, the tabs 18a will snap into one opposed set of notches 16b holding the cradle 16 in a fixed position relative to the stand 18. When the user desires that the cradle 16 be rotated further relative to the stand 18, the user may exert a further force on the cradle 16 to rotate relative to the stand 18. This will force the tabs 18a to compress allowing the tabs 18a to further move through the channel 16a until the tabs 18a extend into another opposed set of notches 16b to hold the cradle 16 in another fixed position relative to the stand 18. This process may be repeated allowing the user to rotate the cradle 16 into varying fixed positions relative to the stand 18. The cradle attachment member 24 may comprise integral portions of the cradle 16 and the stand 18, may be made using a selective laser sintering 3-D printing process, and may be plastic. In other embodiments, the cradle attachment member 24 may vary in manufacture, shape, size, structure, quantity, configuration, orientation, or material.

As shown collectively in FIGS. 3-6, a rotation member 26 is configured to allow rotation of the electronic display 12 when it is attached to the electronic display attachment member 20 of the cradle 16. In one embodiment, the rotation member 26 comprises the cradle attachment member 24. In this embodiment, the rotation member 26 comprises a portion of the cradle 16 comprising the channel 16a, and a portion of the stand 18 comprising the tabs 18a. The rotation member 26 may comprise integral portions of the cradle 16 and the stand 18, may be made using a selective laser sintering 3-D printing process, and may be plastic. In other embodiments, the rotation member 26 may vary in manufacture, shape, size, structure, quantity, configuration, orientation, or material.

FIG. 7 illustrates a back perspective view of another embodiment of a mounting apparatus 100 holding an electronic display 120. In this embodiment, the stand 180 comprises a fixed stand portion 180a and a rotatable stand portion 180b which is configured to rotate relative to the fixed stand portion 180a. The rotatable stand portion 180b is fixedly attached to the cradle 160. As a result, the user is able to rotate the electronic display 120 by rotating the cradle 160 which rotates the rotatable stand portion 180b relative to the fixed stand portion 180a which is fixedly attached to the instrument panel 130 of the aircraft 140. In this embodiment, the rotation member which allows rotation of the electronic display 120 comprises the rotatable stand portion 180b of the stand 180.

FIG. 8 illustrates a back perspective view of another embodiment of a mounting apparatus 200 holding an electronic display 220. In this embodiment, the cradle 260 comprises a fixed cradle portion 260a and a rotatable cradle portion 260b which is configured to rotate relative to the fixed cradle portion 260a. The rotatable cradle portion 260b is fixedly attached to the portion of the cradle 260 which is holding the electronic display 220. The fixed cradle portion 260a is fixedly attached to the stand 280 which is fixedly attached to the instrument panel 230 of the aircraft 240. As a result, the user is able to rotate the electronic display 220 by rotating the rotatable cradle portion 260b relative to the fixed cradle portion 260a which is fixedly attached to the stand 280 which is fixedly attached to the instrument panel 230 of the aircraft 240. In this embodiment, the rotation member which allows rotation of the electronic display 220 comprises the rotatable cradle portion 260b of the cradle 260.

Figure 9:
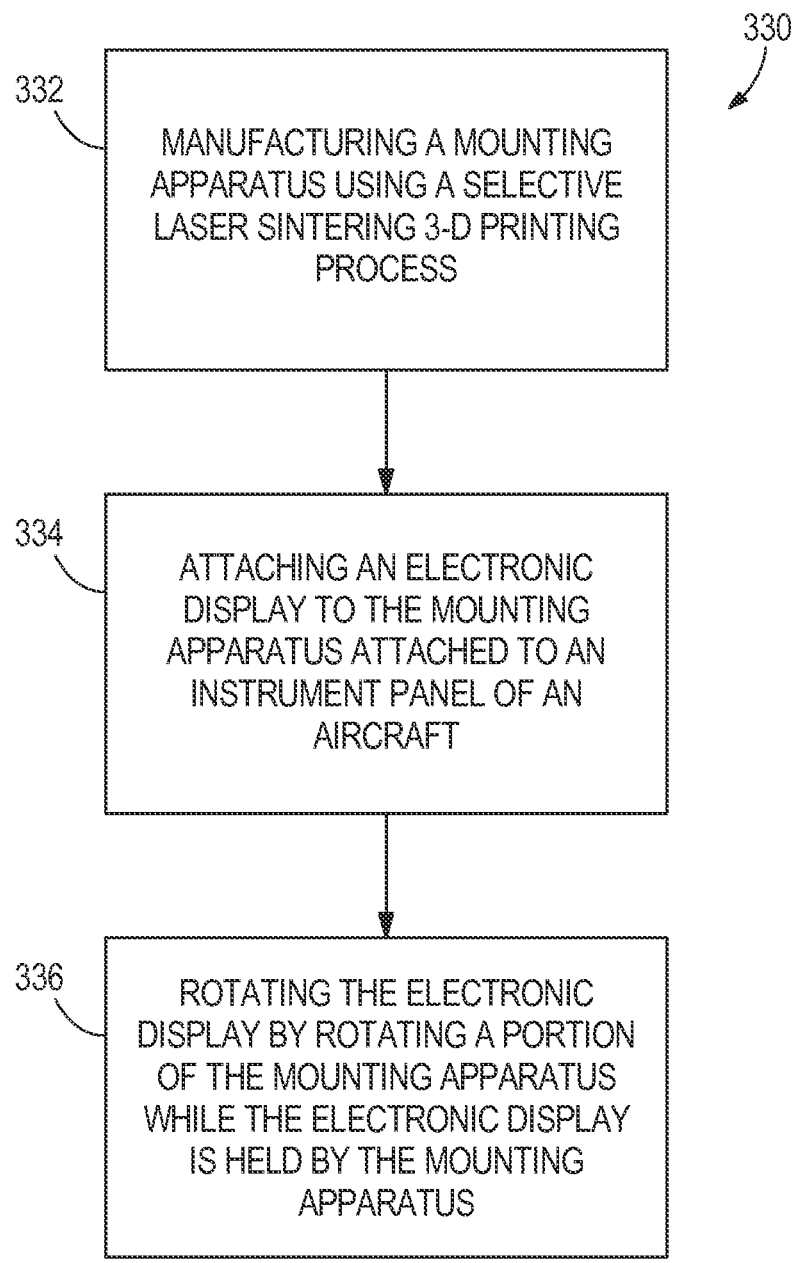
FIG. 9 is a flowchart illustrating one embodiment of a method of attaching an electronic display to an aircraft.

FIG. 9 is a flowchart illustrating one embodiment of a method 330 of attaching an electronic display to an aircraft. In other embodiments, the method 330 may be used to attach an electronic display to varying structures. In step 332, a mounting apparatus is manufactured using a selective laser sintering 3-D printing process. In one embodiment, the mounting apparatus may comprise a stand, a cradle, and an electronic display attachment member. In step 334, an electronic display is attached to the mounting apparatus attached to an instrument panel of an aircraft. The electronic display comprises a tablet, an IPad, an electronic flight bag device, or a hand-held computer. In another embodiment, the electronic display may vary. In one embodiment, step 334 may comprise: attaching a stand of the mounting apparatus to the instrument panel of the aircraft; attaching a cradle of the mounting apparatus to the stand; and attaching the electronic display to the cradle. In one embodiment, the electronic display may be slid into a pocket of the cradle of the mounting apparatus. In step 336, the electronic display is rotated by rotating a portion of the mounting apparatus while the electronic display is held by the mounting apparatus. In one embodiment, step 336 may comprise rotating a portion of the stand relative to another portion of the stand. In another embodiment, step 336 may comprise rotating a portion of the cradle relative to another portion of the cradle. In yet another embodiment, step 336 may comprise rotating the cradle relative to the stand. In another embodiment, any of the steps of the method 330 may not be followed, may be modified in substance or in order, or one or more additional steps may be added.

One or more embodiments of the disclosure may allow for an electronic display to be rotateably mounted to an instrument panel of an aircraft, or to another structure, without interfering with usage of the instrument panel. The mounting apparatus of the disclosure may be easy to manufacture and install at a reduced cost relative to other mounting apparatus.

The Abstract is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true scope of the subject matter described herein. Furthermore, it is to be understood that the disclosure is defined by the appended claims. Accordingly, the disclosure is not to be restricted except in light of the appended claims and their equivalents.

The invention claimed is:

1. A mounting apparatus comprising:
   a cradle comprising:
      a backplate that includes a first side and an opposing second side;
      a plurality of rails extending from the first side along edges of the backplate, the plurality of rails defining a slotted pocket that is sized to receive a portable electronic device therein; and
      a circular channel formed on the second side of the backplate, the circular channel including a plurality of notches formed therein; and
   a stand comprising:
      a circular base;
      a plurality of resilient tabs, each tab including a first end that is formed unitarily with the base and a second latch end, wherein the second latch end is sized to be received within the circular channel, wherein the resilient tabs engage the notches in an undeflected state to maintain the cradle in a first radial position, and wherein the resilient tabs disengage from the notches in a deflected state to enable rotation of the cradle to a second radial position; and
      a plurality of arcuate wall portions formed unitarily with the base, wherein an arcuate wall portion extends over most of a portion of the perimeter of the base between each pair of adjacent tabs, and wherein the wall portions are arrangable in a sliding, contacting relationship with the circular channel when the second latch ends of the tabs are received within the circular channel.

2. The mounting apparatus of claim 1 wherein the mounting apparatus comprises an aircraft mounting apparatus which is configured to mount the electronic display to an aircraft instrument panel.

3. The mounting apparatus of claim 1 further comprising a stand attachment member which is configured to removably attach the stand to a support surface.

4. The mounting apparatus of claim 1, wherein the tabs are maintained within the channel when the cradles is moved from the first radial position to the second radial position.

5. The mounting apparatus of claim 1, wherein the tabs extend in a perpendicular direction from the base.

6. The mounting apparatus of claim 1, wherein the circular channel includes six notches arranged around the circumference of the circular channel.

7. The mounting apparatus of claim 1, wherein the circular channel includes twelve notches arranged around the circumference of the circular channel.

8. The mounting apparatus of claim 1, wherein the circular channel includes six notches arranged around the circumference of the circular channel in an evenly-spaced manner.

9. The mounting apparatus of claim 1, wherein the circular channel includes twelve notches arranged around the circumference of the circular channel in an evenly-spaced manner.

10. The mounting apparatus of claim 1, wherein the notches formed in the circular channel include an arcuate profile.

11. The mounting apparatus of claim 1, wherein gaps between the wall portions and the resilient tabs is substantially less than a width of the tabs.

* * * * *